US009107286B2

(12) United States Patent
Tsuchiya et al.

(10) Patent No.: US 9,107,286 B2
(45) Date of Patent: Aug. 11, 2015

(54) ELECTRICAL STORAGE DEVICE AND CONSTRUCTION MACHINE PROVIDED WITH SAME

(75) Inventors: Junichirou Tsuchiya, Odawara (JP); Akihiko Souda, Fujisawa (JP)

(73) Assignee: Komatsu Ltd., Minato-ku, Tokyo (JP)

( * ) Notice: Subject to any disclaimer, the term of this patent is extended or adjusted under 35 U.S.C. 154(b) by 91 days.

(21) Appl. No.: 13/816,632

(22) PCT Filed: Mar. 19, 2012

(86) PCT No.: PCT/JP2012/057042
§ 371 (c)(1),
(2), (4) Date: Feb. 12, 2013

(87) PCT Pub. No.: WO2012/133000
PCT Pub. Date: Oct. 4, 2012

(65) Prior Publication Data
US 2013/0141889 A1    Jun. 6, 2013

(30) Foreign Application Priority Data

Mar. 30, 2011 (JP) .................. 2011-074869

(51) Int. Cl.
*H05K 5/00* (2006.01)
*E02F 9/08* (2006.01)
(Continued)

(52) U.S. Cl.
CPC ............ *H05K 5/0004* (2013.01); *E02F 9/0858* (2013.01); *E02F 9/2091* (2013.01);
(Continued)

(58) Field of Classification Search
CPC ....... H01L 51/447; H01L 51/52; H01L 27/32; H04B 1/082; H04B 15/02; H05K 9/0047; H05K 13/00; H05K 2201/10446; H05K 5/0217; H05K 7/20418; H05K 9/0007; B60R 16/04; G05F 1/10; Y02E 60/12; Y02T 10/7005; Y02T 10/7077; Y02T 10/7055; Y02T 90/16; B60K 1/04; B60K 2001/0411; B60K 2001/0416; B60K 2001/0438; B60K 2001/0455; B60T 17/22; F21V 17/12; F21V 15/01; F21V 19/001; F21V 21/406; F21S 9/02; H01G 11/24
USPC .............. 361/502, 434, 54, 679.02, 231, 541, 361/728, 759, 760, 821; 29/25.03; 320/166, 320/107, 106, 110, 111, 134, 157
See application file for complete search history.

(56) References Cited

U.S. PATENT DOCUMENTS 5,444,378 A * 8/1995 Rogers ........................... 324/428
6,417,668 B1 * 7/2002 Howard et al. ................ 324/426
(Continued)

FOREIGN PATENT DOCUMENTS

CN           1781230 A        5/2006
JP      H08-288665 A        11/1996
(Continued)

OTHER PUBLICATIONS

English translation of International Preliminary Report on Patentability issued Oct. 8, 2013 from corresponding International Application No. PCT/JP2012/057042, 6 pages.
(Continued)

*Primary Examiner* — Hoa C Nguyen
*Assistant Examiner* — Michael Matey
(74) *Attorney, Agent, or Firm* — Fish & Richardson P.C.

(57) ABSTRACT

An electric storage device includes a plurality of capacitor cells (electric-power storage cells) and a casing that houses the capacitor cells. The casing includes an inspection window through which a condition display unit provided inside the casing is visually checkable. The inspection window includes a through hole that penetrates the casing, a resin plate that closes the through hole from an inside of the casing, and a seal member that is interposed between the resin plate and an inner surface of the casing around the through hole.

16 Claims, 8 Drawing Sheets

(51) Int. Cl.
*E02F 9/20* (2006.01)
*H01G 2/04* (2006.01)
*H01G 2/10* (2006.01)
*H01M 2/10* (2006.01)
*H01M 10/42* (2006.01)

(52) U.S. Cl.
CPC ............... *H01G 2/04* (2013.01); *H01G 2/103* (2013.01); *H01M 2/1077* (2013.01); *H01M 2/1083* (2013.01); *H01M 10/42* (2013.01)

(56) References Cited

U.S. PATENT DOCUMENTS

| | | | |
|---|---|---|---|
| 2006/0061937 A1* | 3/2006 | Takemoto et al. | 361/328 |
| 2010/0060243 A1* | 3/2010 | Niigaki et al. | 320/166 |
| 2011/0007480 A1* | 1/2011 | Souda | 361/728 |
| 2011/0244282 A1* | 10/2011 | Seto et al. | 429/82 |
| 2011/0299265 A1* | 12/2011 | Nakatsu et al. | 361/820 |
| 2012/0082887 A1* | 4/2012 | Ninomiya et al. | 429/159 |

FOREIGN PATENT DOCUMENTS

| | | |
|---|---|---|
| JP | H09-199872 A | 7/1997 |
| JP | 2004-114775 A | 4/2004 |
| JP | 2009-123568 A | 6/2009 |

OTHER PUBLICATIONS

Notice of Reason(s) for Rejection dated Jan. 22, 2013 from Japanese Application No. JP 2011-074869, including English translation, 5 pages.

International Search Report mailed Jun. 19, 2012 from International Application No. PCT/JP2012/057042, including English translation, 4 pages.

Office Action issued Feb. 11, 2015 for corresponding Chinese Patent Application No. 201280002435.9, including English translation, 12 pages.

* cited by examiner

ELECTRICAL STORAGE DEVICE AND CONSTRUCTION MACHINE PROVIDED WITH SAME

CROSS REFERENCE TO RELATED APPLICATIONS

This application claims priority to Application No. PCT/JP2012/057042, filed on Mar. 19, 2012, which application claims priority to Japanese Application No. 2011-074869, filed on Mar. 30, 2011. The entire contents of the above applications are incorporated herein by reference in their entireties.

TECHNICAL FIELD

The present invention relates to an electric storage device such as a capacitor and a construction machine provided with the same, particularly to an improvement in an electric storage device mounted in a hybrid construction machine.

BACKGROUND ART

As a work machine, there has been known a hybrid construction machine in which an engine drives a generator motor and a hydraulic pump, whereby an electric motor for an upper rotary body where a cab and the like are provided is driven by electric power generated by the generator motor while a hydraulic actuator for an operating device and a hydraulic motor for a traveling device are driven by a pressure oil from the hydraulic pump. The electric power generated by the generator motor is charged in a capacitor serving as an electric storage device and is outputted from the capacitor to the electric motor through an inverter.

In such a hybrid construction machine, on performing various maintenance, for security reasons, a voltage of the capacitor needs to be reduced to a predetermined level and a contactor provided at an output portion from the capacitor needs to be turned off (open). Thus, careful attention needs to be paid to avoid output of the electric power charged in the capacitor.

Accordingly, an inspection window for checking a discharge amount of the capacitor and conditions of the contactor is provided on an outer surface of a casing of the capacitor. By visually checking a lighting condition of an LED (light emitting diode) through the inspection window, the conditions of the contactor and a charging condition of the capacitor can be recognized. As such an inspection window, an inspection window (transparent window) provided on an upper case of a power supply package has been typically known although the inspection window is not used for a hybrid construction machine (see Patent Literature 1).

Patent Literature 1 discloses that the inspection window is provided for checking a battery fluid level indicator housed inside the case and for checking various conditions of the battery using a battery hydrometer and the like.

CITATION LIST

Patent Literature(s)

Patent Literature 1 JP-A-2004-114775

SUMMARY OF THE INVENTION

Problem to be Solved by the Invention

However, since Patent Literature 1 fails to disclose a detailed structure of the inspection window, it is impossible to easily apply such an inspection window to a construction machine requiring a high waterproof performance. Specifically, in the capacitor used in the construction machine, the inspection window is provided on an outer surface of a casing of the capacitor for visibility reasons while a circuit substrate having an LED to be visually checked through the inspection window is disposed inside the capacitor. In this arrangement, for instance, when the inspection window is provided on an upper surface of the casing, the circuit substrate is positioned just below the inspection window. Accordingly, waterdrops having entered through the inspection window directly drop on the circuit substrate to easily cause failure.

Further, since a great number of capacitor cells are disposed under the circuit substrate, when the dropped waterdrops fall between electrodes of the capacitor cells and the casing, an electric failure occurs within the capacitor, which occasionally troubles a drive control of the electric motor.

Typically, a transparent cap made of resin is attached to a through hole by snap-fit method (nail-hooking method) in which an 0-ring is occasionally interposed between a surface of the casing and a flange of the cap facing the surface, or an O-ring is occasionally fitted around a cylindrical portion of the cap inserted into the through hole to seal a gap with an inner circumferential surface of the through hole. However, since hooking of the cap with nails is insufficient, waterproof performance is insufficient.

An object of the invention is to provide an electric storage device capable of reliably checking conditions and improving waterproof performance, and a construction machine provided with the electric storage device.

Means for Solving the Problems

According to a first aspect of the invention, an electric storage device includes: a plurality of electric-power storage cells; and a casing that houses the electric-power storage cells, in which the casing includes an inspection window through which a condition display unit provided inside the casing is visually checkable, and the inspection window includes: a through hole that penetrates the casing; a plate having a transmission property that closes the through hole from an inside of the casing; and a seal member that is interposed between the plate and an inner surface of the casing around the through hole.

In an electric storage device according to a second aspect of the invention, the plate having a transmission property is a resin plate, a metal plate is attached to a surface of the resin plate facing the condition display unit, and the resin plate and the metal plate are fixed to the casing by a shared screw.

In an electric storage device according to a third aspect of the invention, a bolt having a transmission property is screwed into the through hole.

In an electric storage device according to a fourth aspect of the invention, the casing comprises a bulging portion that bulges out from a top surface of the casing, the bulging portion comprises a recess in a form of a through-cut having a predetermined width and a predetermined depth, the through hole is provided in the recess, and a head of the bolt is positioned lower than a top of the bulging portion.

According to a fifth aspect of the invention, a construction machine is installed with the electric storage device according to any one of the above-described aspects of the invention.

According to the first and fifth aspects of the invention, since the through hole for visually checking the condition display unit is closed from the inside of the casing by the plate having a transmission property and the seal member seals between the plate and the inner surface of the casing around the through hole, the plate itself is not required to be set on an exterior of the casing, so that the plate is unlikely to be intentionally removed from the exterior or to be hit by a tool or the like to be damaged. Consequently, waterproof performance of the electric storage device can be reliably ensured.

According to the second aspect of the invention, since the resin plate is attached with the metal plate excellent in strength and is screwed to the casing through the metal plate, a head of the screw, a metal washer and the like do not directly contact with the resin plate and the head, the metal washer and the like can be prevented from biting the resin plate in a tightening operation of the screw. Accordingly, tightening levels of the screw are less likely to be variable and the entire seal member can be evenly pressed, so that waterproof performance can be further improved. Moreover, since stress onto the resin plate can be softened, damage to the resin plate can be reduced.

According to the third aspect of the invention, since the through hole is plugged by the bolt having a transmission property, the waterproof performance can be further improved. At this time, by fixing the bolt to the through hole with an adhesive, mischief such as removal of the bolt can be prevented.

According to the fourth aspect of the invention, since the bulging portion remains on both sides of the recess and the head of the bolt is positioned lower than the top of the bulging portion, even when a maintenance worker erroneously drops a tool and the like onto the inspection window, the bolt is guarded by the bulging portion and damage to the bolt by being hit by the tool can be prevented.

DESCRIPTION OF EMBODIMENT(S)

An exemplary embodiment of the invention will be described below with reference to attached drawings.

Figure 1:
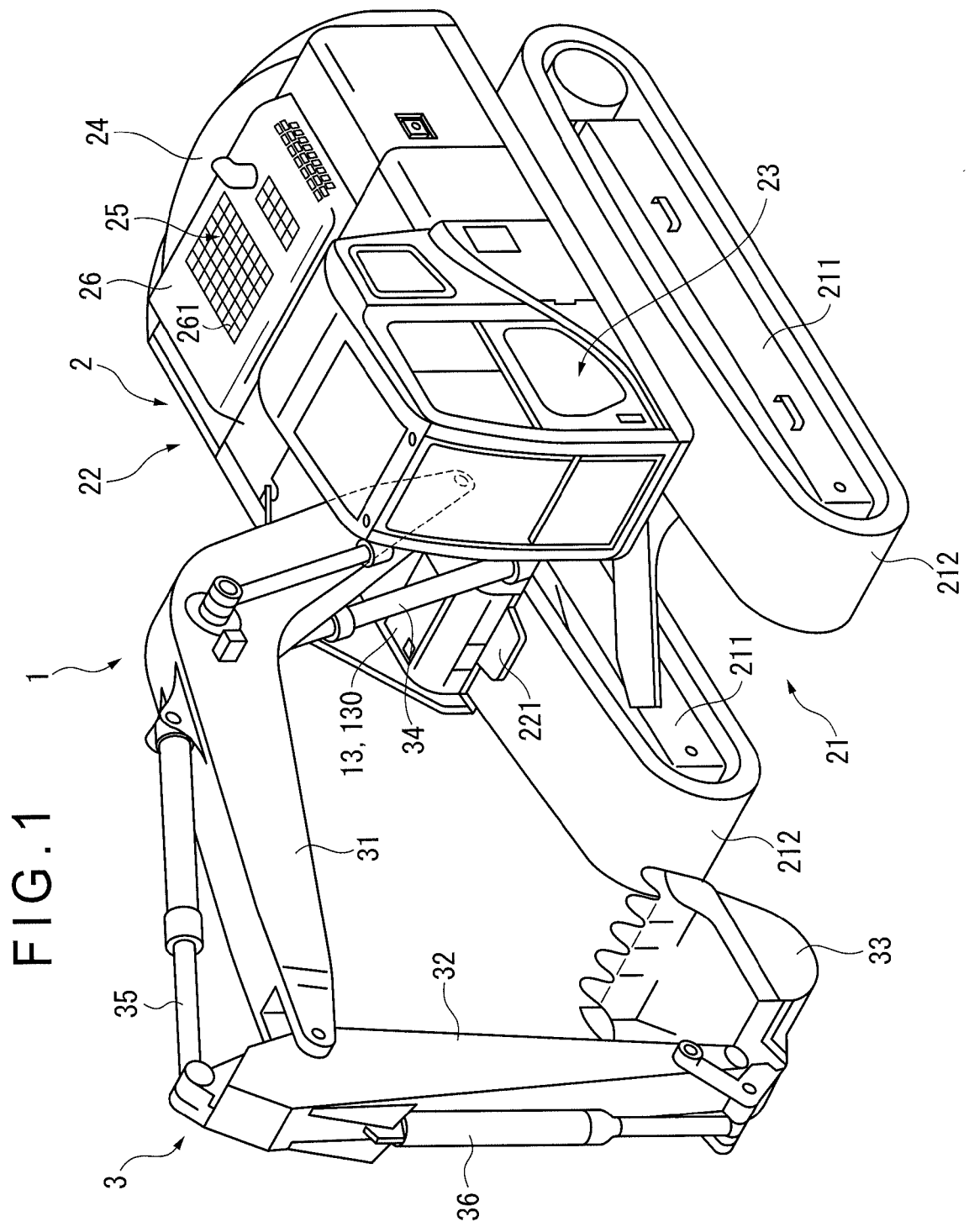
FIG. 1 is a perspective view of a hybrid hydraulic excavator according to an exemplary embodiment of the invention.

FIG. 1 shows a hybrid hydraulic excavator 1 serving as a work machine according to the exemplary embodiment. The hybrid hydraulic excavator 1 includes a vehicle body 2 and working equipment 3.

The vehicle body 2 includes a carrier 21 and a rotary body 22 rotatably provided on the carrier 21. The carrier 21 includes a pair of traveling devices 211. The respective traveling devices 211 are provided with crawler belts 212. A later-described hydraulic motor 213 drives the crawler belts 212, whereby the hybrid hydraulic excavator 1 travels.

The rotary body 22 includes a cab 23, a counterweight 24 and an engine room 25. The counterweight 24 is provided for weight balance against the working equipment 3 and is filled with weights. An engine hood 26 covering the engine room 25 has a grid-like opening 261. A cooling air from the outside is taken in the engine room 25 through the opening 261.

The working equipment 3 is attached to a front center of the rotary body 22 and includes a boom 31, an arm 32, a bucket 33, a boom cylinder 34, an arm cylinder 35 and a bucket cylinder 36. A base end of the boom 31 is rotatably connected to the rotary body 22. A distal end of the boom 31 is rotatably connected to a base end of the arm 32. A distal end of the arm 32 is rotatably connected to the bucket 33.

The boom cylinder 34, the arm cylinder 35 and the bucket cylinder 36 are hydraulic cylinders driven by hydraulic oil discharged from the hydraulic pump 6. The boom cylinder 34 actuates the boom 31. The arm cylinder 35 actuates the arm 32. The bucket cylinder 36 actuates the bucket 33.

Figure 2:
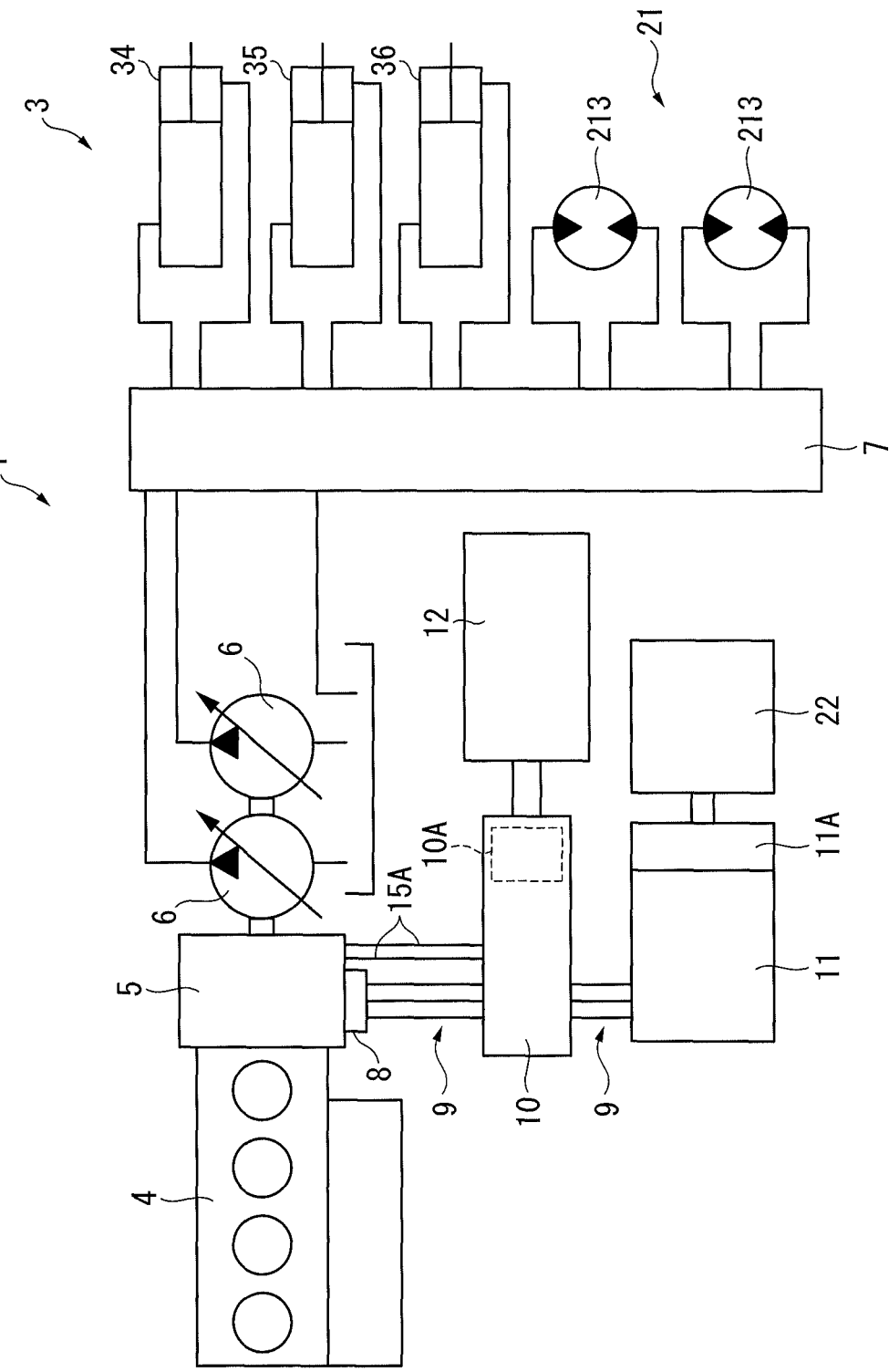
FIG. 2 shows an overall structure of a driving system of the hybrid hydraulic excavator.

FIG. 2 shows an overall structure of a driving system of the hybrid hydraulic excavator 1.

In FIG. 2, the hybrid hydraulic excavator 1 includes an engine 4 serving as a driving source. A generator motor 5 and a pair of hydraulic pumps 6,6 are connected in series to an output shaft of the engine 4 and are driven by the engine 4.

The hydraulic oil fed by pressure from the hydraulic pump 6 is supplied to the working equipment 3 through a control valve 7, whereby the working equipment 3 is hydraulically actuated. The carrier 21 is provided with the hydraulic motor 213 for driving a sprocket to be meshed with a crawler. The hydraulic oil from the hydraulic pump 6 is supplied to the hydraulic motor 213 through the control valve 7.

On the other hand, a power cable 9 is connected to the generator motor 5 through a terminal box 8. Electric power generated by the generator motor 5 is transmitted to an inverter 10 through the power cable 9. One end of another power cable 9 is connected to the inverter 10 while the other end of the power cable 9 is connected to a rotary electric motor 11 for driving the rotary body 22. With this arrangement, the electric power generated by the generator motor 5 is supplied to the rotary electric motor 11 through the inverter 10. Moreover, the generator motor 5 is used as a motor as needed to assist the engine 4.

Moreover, a capacitor 12 serving as an electric storage device is connected to the inverter 10. Accordingly, the electric power generated by the generator motor 5 is stored in the capacitor 12 through the inverter 10. The electric power charged in the capacitor 12 is boosted by a booster 10A. In a rotary operation, the electric power in the capacitor 12 is supplied to the rotary electric motor 11 through the inverter 10. The rotary electric motor 11 drives the rotary body 22, which is rotatably provided to a top of a carrier 21, through a reducer 11A having a planet gear mechanism and the like. Moreover, the electric power in the capacitor 12 is supplied to generator motor 5 as needed to actuate the generator motor 5 as a motor.

Figure 3:
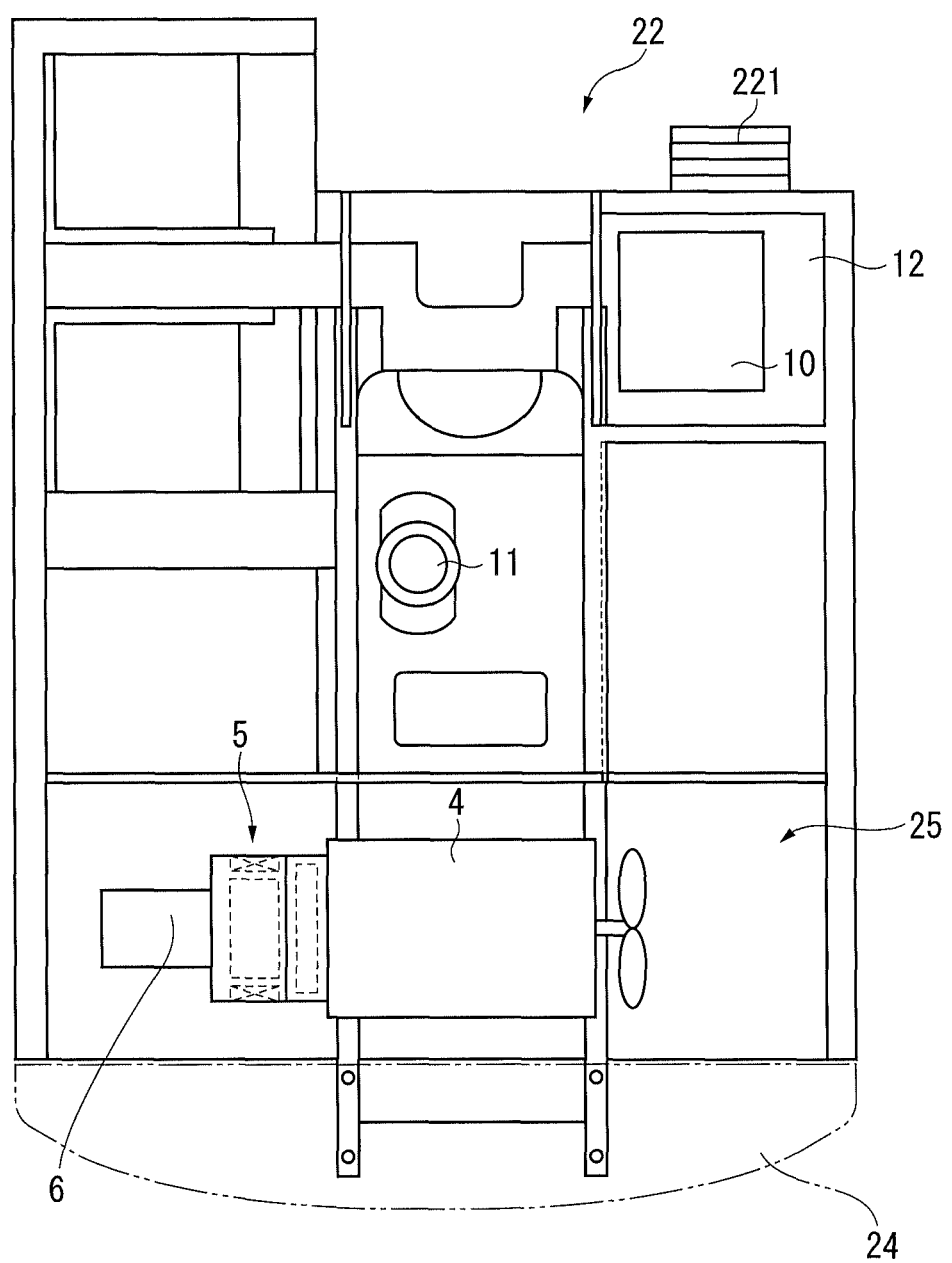
FIG. 3 shows an internal structure of a rotary body of the hybrid hydraulic excavator.

FIG. 3 shows an internal structure and arrangement of the rotary body 22.

In FIG. 3, the inverter 10 and the capacitor 12 are provided on a vehicle front side of the rotary body 22. The rotary electric motor 11 is provided in the center of the rotary body 22. The engine room 25 is provided on a vehicle rear side of the rotary body 22. The counterweight 24 is provided in a further rear of the engine room 25. In the engine room 25, the engine 4, the generator motor 5 and the hydraulic pump 6 are juxtaposed along the counterweight 24.

Figure 4:
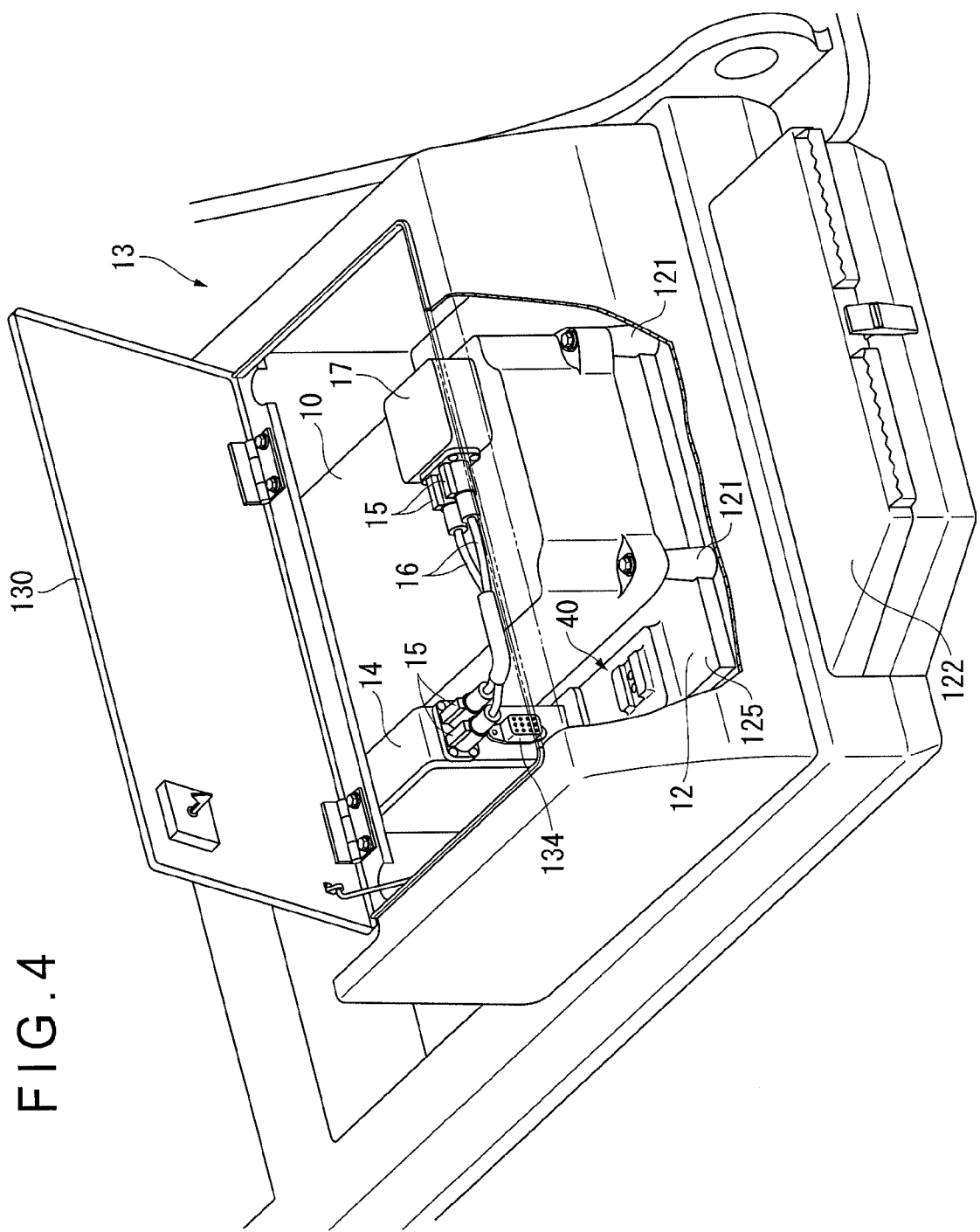
FIG. 4 is a perspective view showing an inverter and a capacitor mounted in the hybrid hydraulic excavator.

Among these components, as shown in FIG. 4, the inverter 10 and the capacitor 12 are housed in a box-shaped housing 13 provided on a vehicle front right of the rotary body 22. An upper surface of the housing 13 serves as an opening/closing cover 130 that is openable upward and closable. This opening/closing cover 130 serves as a footboard and is used with a footboard 221 in front of the opening/closing cover 130 when an operator gets access to the engine room 25.

Here, the inverter 10 is mounted on a plurality of bosses 121 provided on an upper portion of the capacitor 12. In addition to the inverter 10, a fuse box 14 is attached to the capacitor 12. A positive wire and a negative wire in the fuse box 14 are respectively connected via a connector 15 and a power cable 16 to wires of a terminal box 17 integrated with the inverter 10.

Before performing maintenance of the vehicle, the opening/closing cover 130 of the housing 13 is opened and a condition of the capacitor 12 is checked. Accordingly, an inspection window 40 is provided on the capacitor 12 in order to check the condition. The inspection window 40 will be described in detail below.

Figure 5:
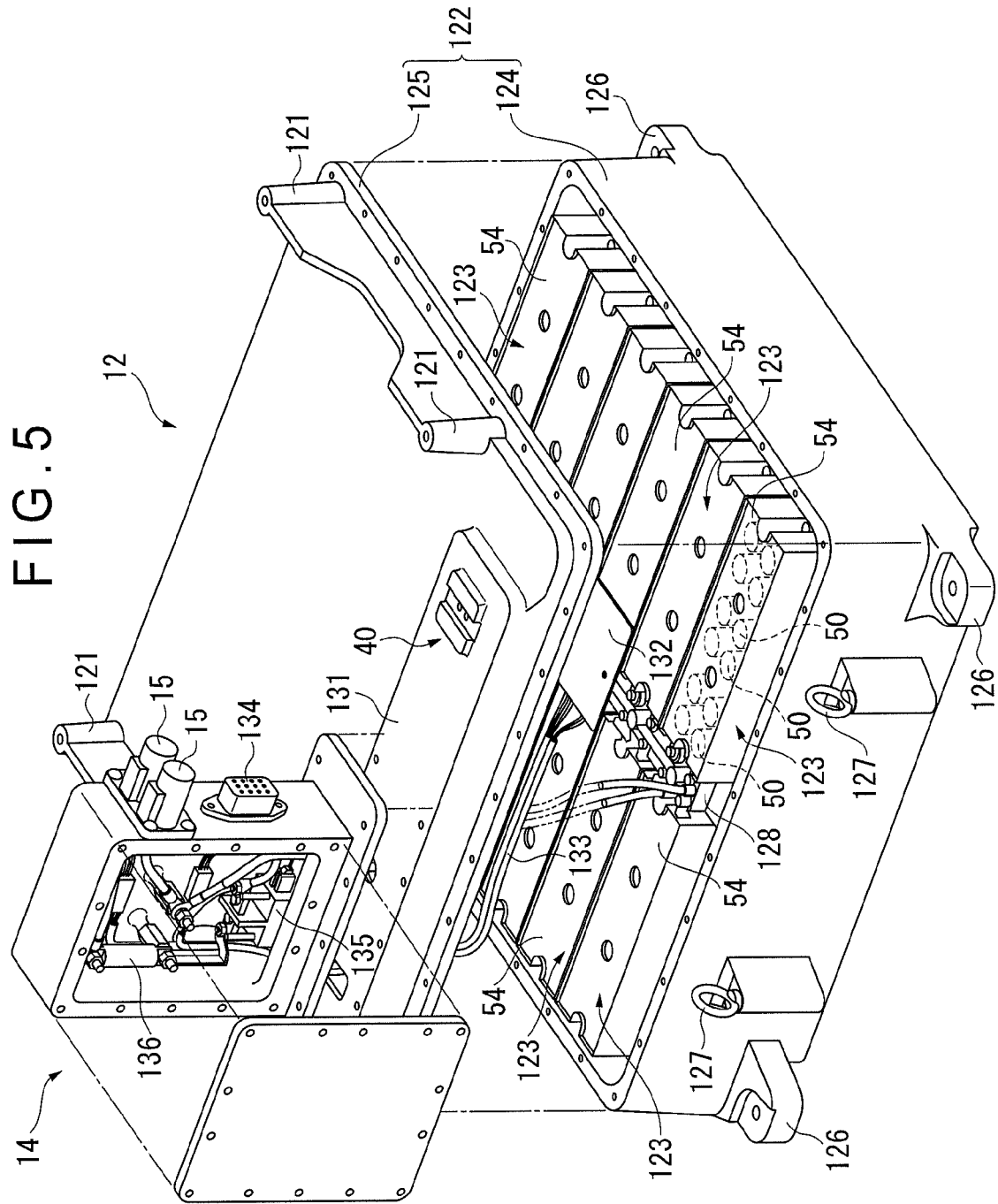
FIG. 5 is an exploded perspective view showing the capacitor and a fuse box which form an electric control unit.

FIG. 5 shows an internal structure of the capacitor 12 and the fuse box 14.

As shown in FIG. 5, the capacitor 12 includes a plurality of capacitor units (twelve capacitor units in this exemplary embodiment) covered with a casing 122 made of aluminium.

The casing 122 includes: a case 124 shaped in a bottomed box; and a cover 125 with which the top of the case 124 is covered. A periphery of the cover 125 is fixed to a periphery of the case 124 with multiple bolts (not shown) from the above.

A setting portion 126 that is set in the housing 13 through a rubber mount and the like is provided at each of four corners of the case 124. A suspension bolt 127 that allows a crane to suspend an entire capacitor 12 is provided on a side surface of the case 124. A terminal block 128 for connecting capacitor units 123 in series is provided inside the case 124.

A cooling water path 129 (FIG. 6) through which cooling water passes is formed at a bottom of the case 124, so that capacitor cells 50 of each of the capacitor units 123 are cooled by the cooling water path 129. In the exemplary embodiment, each of the capacitor units 123 is provided with twelve capacitor cells 50 (electric-power storage cells). The cooling water path 129 is connected by a cooling-water inflow hose and a cooling-water outflow hose to an exterior cooling water pump for circulating cooling water.

In addition to the bosses 121, a fixing portion 131 on which the fuse box 14 is fixed is provided to the cover 125. The fixing portion 131 is provided at a position higher by one step than a top surface of the cover 125. Accordingly, the cover 125 includes a space formed on a back side of the cover 125. A ceiling portion of the space corresponding to the fixing portion 131 is higher by one step than the rest of the surface of the back side. A circuit substrate 132 is screwed from underneath to the back side of the fixing portion 131.

A plurality of signal cables 133 are connected to the circuit substrate 132 and are wired to the fuse box 14 without contact with the capacitor units 123 by passing through the space on the back side of the fixing portion 131.

The circuit substrate 132 includes: a condition judging unit that judges a condition of a charge voltage of the capacitor 12 and an open/closed condition of a later-described contactor 135; and a condition display unit that displays a judgment result of the condition judging unit. In the exemplary embodiment, the condition judging unit is formed by a plurality of LEDs (e.g., two of LED 137 and LED 138 in the exemplary embodiment).

In the fuse box 14, the contactor 135 is provided on a connection line between the capacitor 12 and the inverter 10 while being electrically connected to the capacitor 12 and the inverter 10. Some of the signal cables 133 are connected to the contactor 135. The circuit substrate 132 is connected to the contactor 135 via the some of the signal cables 133. With this arrangement, for instance, when the contactor 135 is turned on (closed), one of LEDs (e.g., LED 137 (see FIG. 7)) installed on the circuit substrate 132 is lighted on.

Moreover, in the fuse box 14, a cable from the terminal block 128 of the capacitor 12 is connected to another of the signal cables 133, through which a capacitor voltage is applied to the circuit substrate 132. Accordingly, when a charge voltage of the capacitor 12 is, for instance, 50 V or more, LED 138 (i.e., the other of LEDs) installed on the circuit substrate 132 is lighted on. When it is confirmed that both of LED 137 and LED 138 are turned off, maintenance of the hybrid hydraulic excavator 1 is started. Note that LED 137 and LED 138 are positioned to face the above-mentioned inspection window 40.

Moreover, the signal cables 133 are connected to the connector 134 of the fuse box 14. The connector 134 is connected to a controller (not shown) that controls a primary section of the hybrid hydraulic excavator 1.

Figure 6:
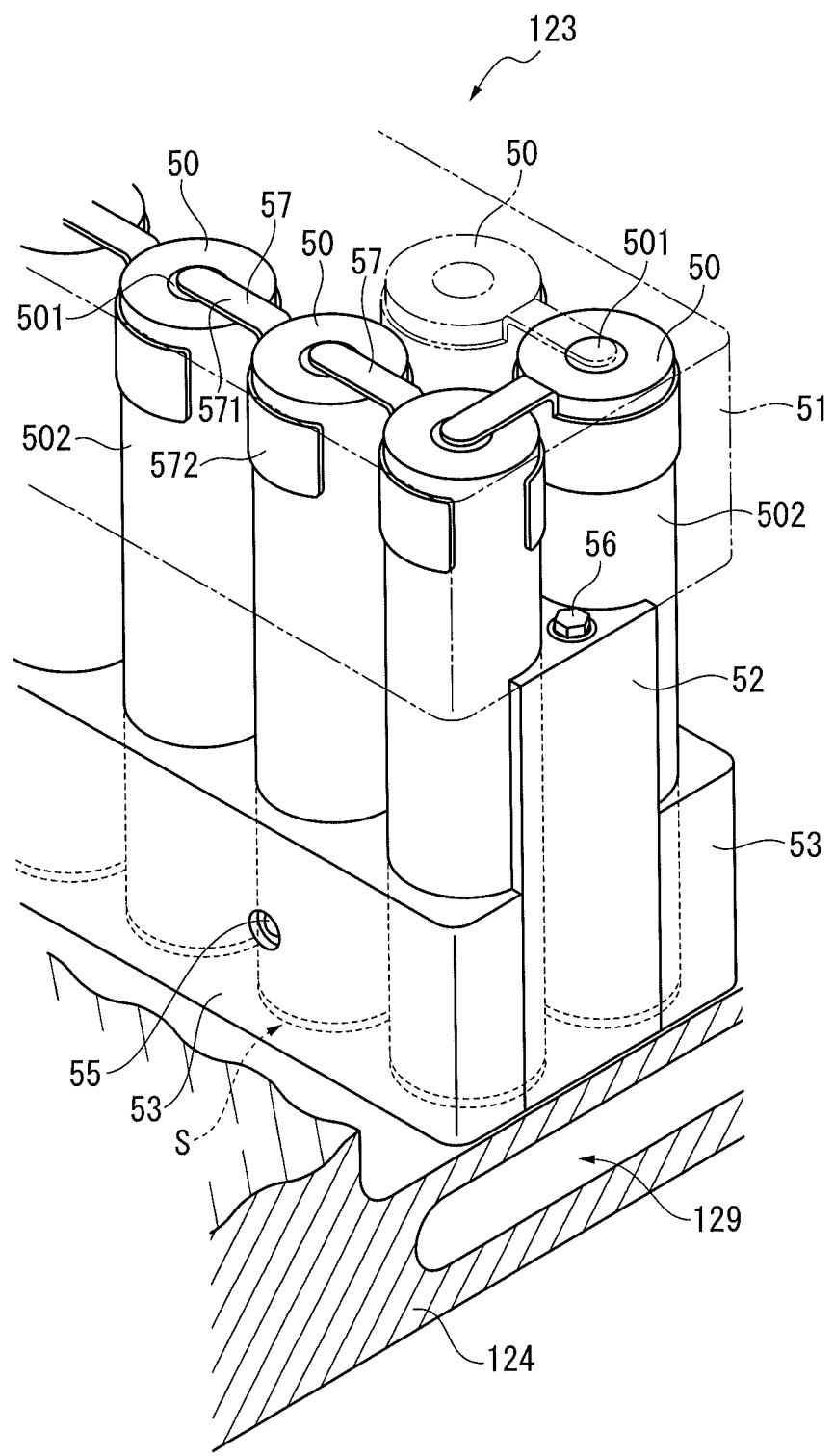
FIG. 6 is a perspective view showing an example of the capacitor unit.

FIG. 6 shows a part of the capacitor unit 123.

As shown in FIGS. 5 and 6, the capacitor unit 123 includes: twelve capacitor cells 50 that are disposed in two lines; a resin-made upper-portion holding member 51 that holds upper portions of the capacitor cells 50; an aluminum-made heat sink 52 that is interposed between the two lines of the capacitor cells 50 in a manner to be continuous in a direction of the lines; resin-made lower-portion holding members 53,53 that are disposed on both sides of the heat sink 52; and a balance circuit substrate 54 that is disposed on the upper-portion holding member 51.

While the upper-portion holding member 51 holds the upper portions of the twelve capacitor cells 50 collectively, the lower-portion holding members 53 hold the capacitor cells 50 with the heat sink 52 and is fixed to the heat sink 52 by a bolt 55. The heat sink 52 is fixed to a bottom of the case 124 by a vertically elongated bolt 56.

A positive electrode 501 is formed on a top of each of the capacitor cells 50. An outer circumferential portion of each of the capacitor cells 50 is formed as a negative electrode 502. The positive electrode 501 of one of adjacent ones of the capacitor cells 50 is electrically connected to the negative electrode 502 of the other of the adjacent ones of the capacitor cells 50 by a conductive member 57. Specifically, the conductive member 57 includes: a tongue piece 571 that contacts with the positive electrode 501 of the one of adjacent ones of the capacitor cells 50; and a holder 572 that holds the negative electrode 502 of the other of the adjacent ones of the capacitor cells 50.

An electrode (not shown) is drawn out from each of the capacitor cells 50 near the terminal block 128 through another conductive member. The capacitor cells 50 of adjacent ones of the capacitor units 123 are electrically conducted by connecting the electrodes drawn out to the terminal block 128 by a linear conductive member.

The negative electrode 502 of each of the capacitor cells 50 is in contact with the heat sink 52 with a portion insulated by coating and the like as needed. Heat generated by loss within the capacitor cells 50 is transmitted to the heat sink 52. Since the heat sink 52 in contact with the bottom of the case 124 is cooled by cooling water flowing through the cooling water path 129, heat exchange is performed on the heat sink 52, resulting in no radiation outside. By this heat exchange, the capacitor 12 is kept at a predetermined temperature.

An electric circuit for controlling variability of electric charge/discharge of twelve capacitor cells 50 is formed on the balance circuit substrate 54. In addition to the above-mentioned tongue piece 571 and the holder 572, a pin-like portion (not shown) is integrally formed with the conductive member 57 and is inserted into a through hole of the balance circuit substrate 54 from beneath to be electrically conducted with the electric circuit.

A lower end surface of each of the capacitor cells 50 is occasionally defined as a part of the negative electrode 502. In such a case, a clearance S is formed between the lower end surface and the bottom of the case 124. However, when a waterproof performance of the inspection window 40 is insufficient and waterdrops enter the clearance S, the negative electrode 502 and the case 124 are electrically conducted through the waterdrops, causing failure. Moreover, the waterdrops having entered from the inspection window 40 may possibly drop on the circuit substrate 132, which also highly possibly causes failure.

In the hybrid hydraulic excavator 1, it is crucial to prevent failure of hybrid devices such as the capacitor 12 and the inverter 10 and preventive measures are demanded. Accordingly, in the exemplary embodiment, the inspection window 40 having an excellent waterproof performance, which is not recognized in a conventional inspection window, is used. The inspection window 40 will be described in detail below.

Figure 7:
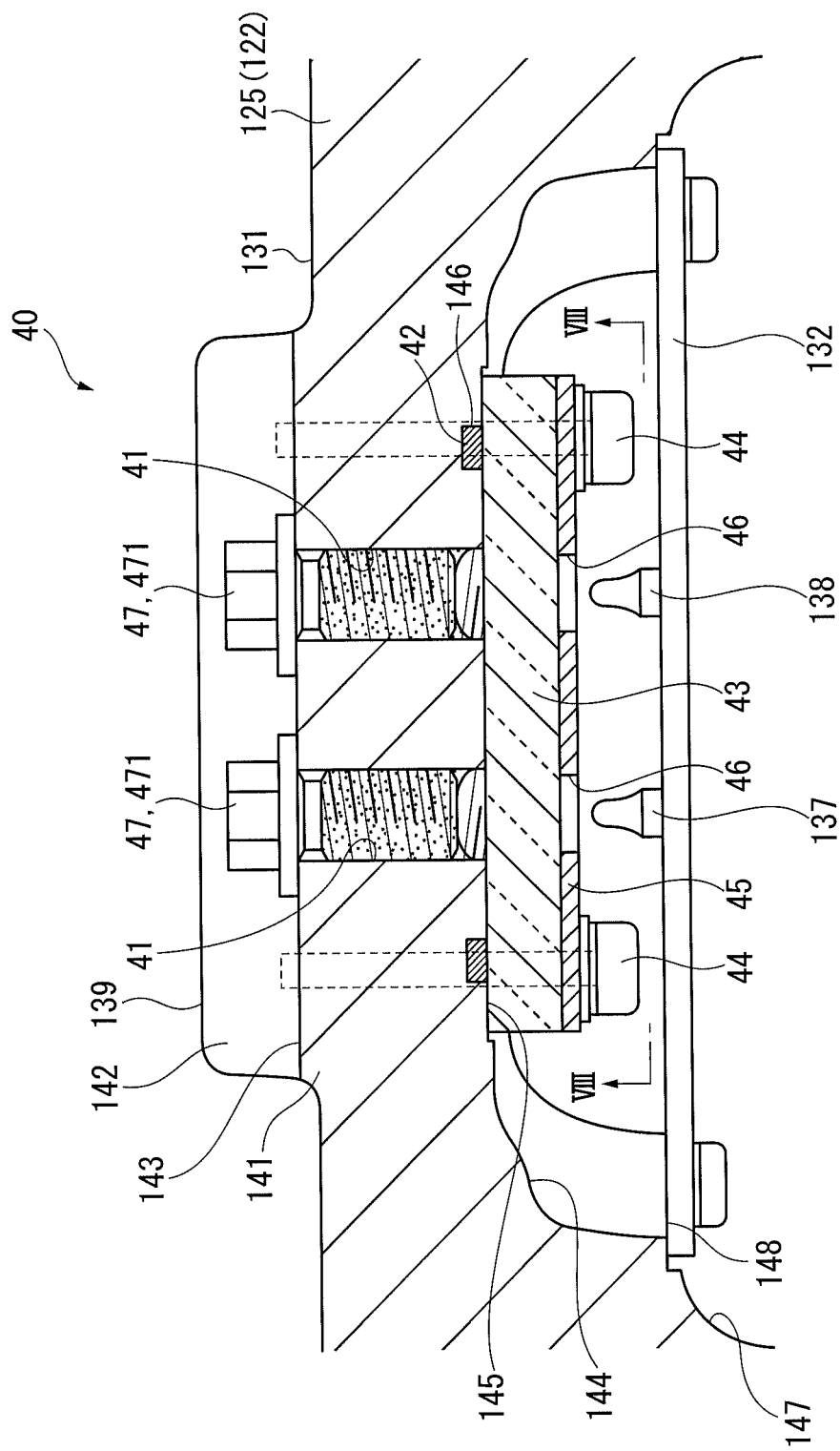
FIG. 7 shows a cross section of an inspection window of the capacitor.
Figure 8:
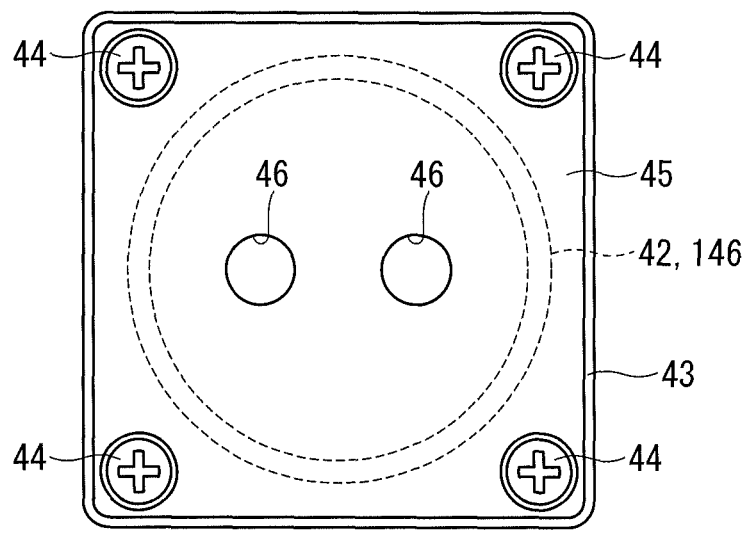
FIG. 8 is an illustration viewed in a direction of arrows VIII-VIII in FIG. 7.

FIGS. 7 and 8 show the inspection window 40.

As shown in FIGS. 7 and 8, in the cover 125 of the capacitor 12, the inspection window 40 includes a pair of through holes 41 that penetrate the fixing portion 131 from a front to a back thereof. On a top surface of the fixing portion 131, a bulging portion 139 that bulges upward higher by one step than the top surface of the fixing portion 131 is provided. The bulging portion 139 includes a cut portion 142 provided by cutting the bulging portion 139 with leaving a step 141 higher by one step than the top surface of the fixing portion 131, the cut portion 142 in a form of a through-cut being defined as a recess having a predetermined width and a predetermined depth (also see FIG. 5). The through holes 41 are provided on a flat bottom 143 (an upper surface of the step 141) of the cut portion 142. The elongated cut portion 142 is formed along a juxtaposing direction of the through holes 41. The through holes 41 correspond to LED 137 and LED 138 on the circuit substrate 132.

On the other hand, a highest position of a back surface of the fixing portion 131 corresponding to the bulging portion 139 is defined as a first ceiling 144. A flat attachment surface 145 is provided to the first ceiling 144. To the attachment surface 145, an annular seal groove 146 is provided to entirely surround the outside of both the through holes 41. A seal member 42 (e.g., an O-ring) is fitted in the seal groove 146. Under this condition, a transparent resin plate 43 shaped in a quadrangle in a plan view is attached from beneath by screws 44 at four corners to the attachment surface 145. The circuit substrate 132 is attached to an attachment surface 148 of a second ceiling 147 that is formed lower by one step in a manner to correspond to the fixing portion 131.

Thus, when the seal member 42 is interposed between an inner surface of the cover 125 and the resin plate 43 to seal therebetween, waterdrops and the like are prevented from entering the capacitor 12 through the through holes 41. Since the resin plate 43 is transparent, a lighting condition of LED 137 and LED 138 can be checked by viewing from the above through the through holes 41, so that a condition of the capacitor 12 can be judged. Moreover, since the resin plate 43 is screwed in the capacitor 12, the screws 44 and the resin plate 43 cannot be intentionally removed from the outside.

Further, a metal plate 45 having substantially the same outer diameter as that of the resin plate 43 is attached to a lower surface of the resin plate 43 (i.e., a surface facing LED 137 and LED 138). The screws 44 also penetrate the metal plate 45, thereby fixing the metal plate 45 to the resin plate 43.

Here, when a head of each of the screws 44 is screwed into the resin plate 43 via a metal washer and the like instead of the metal plate 45, the resin plate 43 is damaged or the metal washer bites into a surface of the resin plate 43 due to a low strength of the resin plate 43. As a result, tightening torque of the four screws 44 is not kept at a constant level, so that the seal member 42 is not evenly pressed to possibly damage sealing performance thereof.

Accordingly, in the exemplary embodiment, the metal plate 45 having a sufficient contact area and being undeformable against tightening of the screws 44 is placed on the resin plate 43 to soften stress onto the resin plate 43, in order to prevent the metal washer from biting into the resin plate 43 and evenly tighten the screws 44 with an appropriate tightening torque. Moreover, since circular hole openings 46 corresponding to LED 137 and LED 138 are provided on the metal plate 45, LED 137 and LED 138 can be visually checked.

Additionally, in the exemplary embodiment, a transparent resin bolt 47 is screwed into each of the through holes 41. A male screw portion of the resin bolt 47 and a female screw portion of the through hole 41 are fixed to each other with a transparent or semi-transparent adhesive, in order to avoid easy removal of the resin bolt 47. Since the through hole 41 is plugged by the resin bolt 47, resistance against lowering of visibility due to entering of water, mud, earth and the like into the through hole 41 is further improved. Since the resin bolt 47 is transparent, the lighting condition of LED 137 and LED 138 can be checked. Additionally, light is dispersible at the head 471 of the resin bolt 47 to be spread through the entire head 471, thereby improving visibility from a diagonal direction.

The head 471 of the resin bolt 47 is housed in a narrow width of the cut portion 142 and is positioned lower than a top of the bulging portion 139. Accordingly, even when a maintenance worker drops a tool or the like onto the inspection window 40 during inspection through the inspection window 40, the tool hits on the bulging portion 139, but is less likely to hit the head 471 to prevent damage to the resin bolt 47.

Furthermore, since the bottom 143 of the cut portion 142 is formed flat on the step 141 positioned higher than the fixing portion 131, waterdrops and the like having fallen on the bottom 143 of the cut portion 142 can flow down onto the fixing portion 131 from both sides of the bottom 143. Thus, prevention of accumulation of waterdrops and the like on the bottom 143 can further improve waterproof performance.

The bulging portion 139 is formed corresponding to a screw hole of the screw 44. Accordingly, the screw hole can be formed elongated, so that the screw 44 is less likely to become loose, which is effective for keeping an effective waterproof performance.

On the cover 125 provided with the above-mentioned inspection window 40, the resin bolt 47 for the inspection window 40 is screwed from a top surface of the cover 125 whereas all of the seal member 42, the resin plate 43, the metal plate 45, the screws 44 and the circuit substrate 132 can be assembled from an inside of the cover 125, resulting in a favorable assembling performance.

Incidentally, the invention is not limited to the above-described exemplary embodiment, but includes modifications and improvements as long as the objects of the invention can be achieved.

In the above exemplary embodiment, the inspection window 40 is provided on the cover 125 of the capacitor 12. However, depending on a structure of the housing 13, the inspection window 40 may be provided to a side surface of the case 124. The position of the inspection window may be determined as needed in implementation.

In the above exemplary embodiment, the pair of through holes 41 are provided corresponding to LED 137 and LED 138. However, a single through hole having a larger diameter may be provided so as to visually check a plurality of LEDs through this through hole.

In the above exemplary embodiment, the cut portion 142 of the bulging portion 139, the metal plate 45 and the resin bolt 47 are used. However, the invention encompasses an arrangement without such portions and members. In short, the invention encompasses any arrangement as long as the through holes 41 for visual check are closed by the transparent resin plate 43 via the seal member 42 from an inside of the casing 122 as described in the above exemplary embodiment.

In the above exemplary embodiment, the cut portion 142 is provided by cutting the bulging portion 139. However, the recess formed to the bulging portion 139 may be formed not only by cutting but also by casting and the like.

In the above exemplary embodiment, the condition display unit is provided by LED 137 and LED 138, but may be provided by a small-sized liquid crystal display.

In the above exemplary embodiment, the plate and the bolt each of which has a transmission property are respectively provided by the transparent resin plate 43 and resin bolt 47. However, the plate and the bolt are not limited to transparent ones. As long as having a transmission property, any plate and bolt may be used.

In the above exemplary embodiment, the electric storage device of the invention is described as the capacitor, but may be provided by a lithium-ion battery, a nickel-hydrogen battery and the like.

The invention claimed is:

1. An electric storage device comprising:
a plurality of electric-power storage cells;
a casing that houses the electric-power storage cells; and
a condition display unit provided inside the casing,
wherein the casing comprises an inspection window through which the condition display unit is visually checkable, and
wherein the inspection window comprises:
a through hole that penetrates the casing,
a plate having a transmission property that closes the through hole from an inside of the casing,
a seal member that is interposed between the plate and an inner surface of the casing, the seal member being disposed outside of and surrounding the through hole, and
a bolt that is screwed into the through hole from an outside of the casing, the bolt having a transmission property to thereby allow visual check of the condition display unit through the bolt.

2. The electric storage device according to claim 1, wherein the plate having a transmission property is a resin plate, a metal plate is attached to a surface of the resin plate facing the condition display unit, and
the resin plate and the metal plate are fixed to the casing by a shared screw.

3. The electric storage device according to claim 1, wherein the casing comprises a bulging portion that bulges out from a top surface of the casing,
the bulging portion comprises a recess in a form of a through-cut having a predetermined width and a predetermined depth,
the through hole is provided in the recess, and
a head of the bolt is positioned lower than a top of the bulging portion.

4. A construction machine installed with the electric storage device according claim 1.

5. The electric storage device according to claim 1, wherein the condition display unit includes one or more light emitting diodes (LEDs).

6. The electric storage device according to claim 1, wherein the condition display unit includes a liquid crystal display.

7. The electric storage device according to claim 1, wherein the bolt is transparent.

8. The electric storage device according to claim 1, wherein the bolt includes a head portion and a screw portion, both the head portion and the screw portion having the transmission property to thereby allow visual check of the condition display unit through the head portion and the screw portion of the bolt.

9. An electric storage device comprising:
a plurality of electric-power storage cells;
a casing that houses the electric-power storage cells; and
a means for displaying a condition of the plurality of electric-power storage cells, the means for displaying the condition of the plurality of electric-power storage cells being provided inside the casing,
wherein the casing comprises an inspection window through which the means for displaying the condition of the plurality of electric-power storage cells is visually checkable, and
wherein the inspection window comprises:
a through hole that penetrates the casing,
a plate having a transmission property that closes the through hole from an inside of the casing,
a seal member that is interposed between the plate and an inner surface of the casing, the seal member being disposed outside of and surrounding the through hole, and
a bolt that is screwed into the through hole from an outside of the casing, the bolt having a transmission property to thereby allow visual check of the means for displaying the condition of the plurality of electric-power storage cells through the bolt.

10. The electric storage device according to claim 9, wherein
the plate having a transmission property is a resin plate,
a metal plate is attached to a surface of the resin plate facing the means for displaying the condition of the plurality of electric-power storage cells, and
the resin plate and the metal plate are fixed to the casing by a shared screw.

11. The electric storage device according to claim 9, wherein
the casing comprises a bulging portion that bulges out from a top surface of the casing,
the bulging portion comprises a recess in a form of a through-cut having a predetermined width and a predetermined depth,
the through hole is provided in the recess, and
a head of the bolt is positioned lower than a top of the bulging portion.

12. A construction machine installed with the electric storage device according claim 9.

13. The electric storage device according to claim 9, wherein the means for displaying the condition of the plurality of electric-power storage cells includes one or more light emitting diodes (LEDs).

14. The electric storage device according to claim 9, wherein the means for displaying the condition of the plurality of electric-power storage cells includes a liquid crystal display.

15. The electric storage device according to claim 9, wherein the bolt is transparent.

16. The electric storage device according to claim 9, wherein the bolt includes a head portion and a screw portion, both the head portion and the screw portion having the transmission property to thereby allow visual check of the means for displaying the condition of the plurality of electric-power storage cells through the head portion and the screw portion of the bolt.

* * * * *